United States Patent
Shiraishi et al.

(10) Patent No.: US 6,611,280 B1
(45) Date of Patent: Aug. 26, 2003

(54) FLEXIBLE CABLE, FLEXIBLE CABLE MOUNT METHOD, SEMICONDUCTOR DEVICE WITH FLEXIBLE CABLE, LED ARRAY HEAD WITH FLEXIBLE CABLE, IMAGE FORMING APPARATUS WITH SUCH LED ARRAY HEAD

(75) Inventors: Mitsuo Shiraishi, Shizuoka-ken (JP); Toshiyuki Sekiya, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/626,487

(22) Filed: Jul. 26, 2000

(30) Foreign Application Priority Data

Jul. 29, 1999 (JP) .............................. 11-215892
Jul. 21, 2000 (JP) ....................... 2000-221372

(51) Int. Cl.$^7$ .............................. B41J 2/45; B41J 2/385
(52) U.S. Cl. ...................................... 347/238; 347/130
(58) Field of Search .................... 347/86, 238, 237, 347/247, 130; 360/97.01, 126; 200/507, 512; 439/77, 98, 449, 455, 457, 474; 83/464

(56) References Cited

U.S. PATENT DOCUMENTS

| 4,267,757 A | * | 5/1981 | Frantz ............................ 83/464 |
| 4,607,147 A | * | 8/1986 | Ono et al. ..................... 200/512 |
| 5,177,405 A | | 1/1993 | Kusuda et al. ............. 315/169.1 |
| 5,205,750 A | * | 4/1993 | Darrow et al. ................. 439/77 |
| 5,237,476 A | * | 8/1993 | Bischoff et al. ............. 360/126 |
| 5,451,977 A | | 9/1995 | Kusuda et al. ................. 345/44 |
| 5,760,997 A | * | 6/1998 | Koyanagi et al. ......... 360/97.01 |
| 6,069,644 A | * | 5/2000 | Tanioka et al. .............. 347/238 |
| 6,170,940 B1 | * | 1/2001 | Shinada et al. ................ 347/86 |

FOREIGN PATENT DOCUMENTS

| JP | 1-238962 | 9/1989 |
| JP | 02-208067 | 8/1990 |
| JP | 2-212170 | 8/1990 |
| JP | 3-20457 | 1/1991 |
| JP | 03-194978 | 8/1991 |
| JP | 4-5872 | 1/1992 |
| JP | 04-023367 | 1/1992 |
| JP | 04-296579 | 10/1992 |
| JP | 05-084971 | 4/1993 |
| JP | 11-123844 | 5/1999 |

OTHER PUBLICATIONS

Kusuda, Y., et al., "Proposal of the Self–scanning Light Emitting Device Using PNPN–thyristor", Nippon Sheet Glass Co., Ltd., Tsukuba Resaerch Laboratory, pp. 43–47 (Mar. 5, 1990).

Kusuda, Y., et al. Proposal of Integrated Light Emitting Device Array with Driving Circuit for photo–printer, Tsukuba Research Laboratory, Nippon Sheet Glass, Co., Ltd., pp. 61–64, Jul. 8, 1991.

* cited by examiner

Primary Examiner—Hai Pham
(74) Attorney, Agent, or Firm—Fitzpatrick, Cella, Harper & Scinto

(57) ABSTRACT

Distortion of an LED array head is eliminated by correcting an electrode pitch misalignment between an LED array substrate and a driver substrate to be caused by thermal expansion or contraction during thermal pressure bonding of a flexible cable. A tear preventing hole is formed in each area between adjacent four-divided areas of the flexible cable. When positions of the flexible cable and driver substrate are to be aligned, a pitch shift adjusting slit line is cut in order to correct the position misalignment to be caused by thermal expansion or contraction generated when the flexible cable is thermal-pressure bonded to the LED substrate. The pitch shift adjusting slit line is formed in the connection area between adjacent four-divided areas.

14 Claims, 10 Drawing Sheets

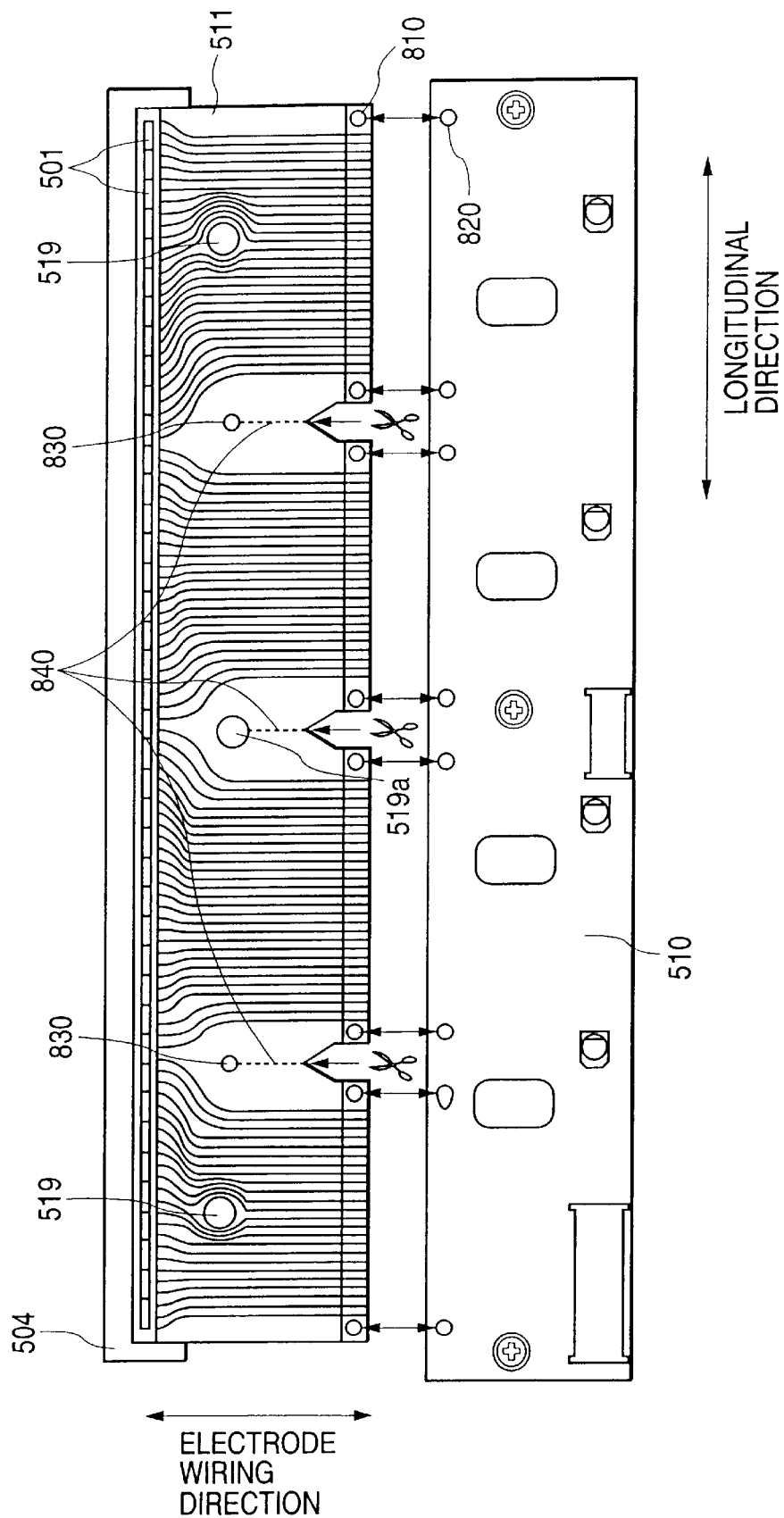

FLEXIBLE CABLE, FLEXIBLE CABLE MOUNT METHOD, SEMICONDUCTOR DEVICE WITH FLEXIBLE CABLE, LED ARRAY HEAD WITH FLEXIBLE CABLE, IMAGE FORMING APPARATUS WITH SUCH LED ARRAY HEAD

BACKGROUND OF THE INVENTION

1. Field of the Invention

The present invention relates to a flexible cable, a flexible cable mount method, an LED array head with a flexible cable, and an image forming apparatus with such an LED array head.

More specifically, the invention relates to a flexible cable for electrically connecting electrodes mounted on a first substrate and electrodes mounted on a second substrate, and a mount method for such a flexible cable.

The invention also relates to an LED array head with such a flexible cable and an image forming apparatus with such an LED array head for forming an image by electrophotography.

2. Related Background Art

A main trend in conventionally known print exposure LED array heads is to mount an LED array chip driver IC on the same substrate of glass epoxy on which an LED array chip, formed with silver foil patterns, is mounted. In such arrangements, it is necessary to perform wire bonding operations a number of times equal to the number of light emitting elements formed on an LED chip of a conventional LED array head, or equal to half the number. Also, it is difficult to form bonding pad patterns on the substrate. For these reasons, it is essential to form both the driver IC and LED array chip on the same substrate juxtaposed in one-to-one correspondence.

This type of print exposure LED array head having the driver IC on the same substrate as the LED array chip is, however, associated with the problem that electrical connection of wiring patterns becomes difficult because the number of wiring lines to be electrically connected increases as the resolution of an LED array chip, and thus its integration degree, is increased. In order to avoid this problem, a large substrate is used. However, a large substrate results in a large LED array head.

A compact LED array head has been realized by using two substrates: an LED array substrate on which an LED array chip is mounted; and a driver substrate on which an LED array chip driver IC is mounted, and by using a flexible cable for electrical connection of these two substrates. An LED array head has also been proposed which can make a printer more compact by reducing the size of the LED array chip for print exposure of a photosensitive member, and thereby reduce the size of the mechanical components around the photosensitive member. A flexible cable is made of resin and has wiring patterns formed on the resin.

Most of conventional flexible cables used by an LED array head are arranged such that a plurality of flexible cable units like the one shown in FIG. 1 are disposed in array along the LED array head. In FIG. 1, reference numeral 100 represents an LED array substrate, reference numeral 102 represents a driver substrate, reference numeral 104 represents flexible cable units, and reference numeral 106 represents an LED chip. Each of a plurality of flexible cable units 104 is mounted at a predetermined position between the LED array substrate 100 and drive substrate 102.

However, there are is increased number of mount steps for mounting a plurality of flexible cable units as compared to a single cable. The number of electrodes of each flexible cable unit of a high resolution LED array head is large, the pitch between electrodes becomes narrow, and a play area in the longitudinal direction of the LED array head is reduced. Therefore, a sufficient space between adjacent flexible cable units becomes difficult to engineer. To avoid this, a flexible cable such as the cable shown in FIG. 2 is presently used which is one continuous cable not divided into cable units and has an increased number of electrodes. In FIG. 2, reference numeral 200 represents an LED array substrate, reference numeral 202 represents a driver substrate, reference numeral 204 represents a flexible cable (single continuous type), and reference numeral 206 represents an LED chip. A cable similar to the flexible cable shown in FIG. 2 is disclosed, for example, in FIG. 1 of Japanese Patent Application Laid-open No. 11-123844.

In mounting a flexible cable of an LED array head arranged such that the LED array substrate and drive substrate are electrically connected by the flexible cable, however, a process which generates heat is necessary. Heat during the mount process causes thermal expansion or contraction of the flexible cable.

This thermal expansion or contraction of the flexible cable generates a small positional misalignment between electrodes formed on the flexible cable and electrodes formed on the driver substrate or LED array substrate. If the flexible cable is mounted by forcibly pulling it in order to correct the position misalignment of the electrodes of the flexible cable, a stress is applied to the LED array substrate that may warp the LED array disposed in a straight line. In this case, a direction of light exposure to the photosensitive member is curved so that a print line may be distorted in some cases.

SUMMARY OF THE INVENTION

It is an object of the invention to solve the above-described problems and provide a flexible cable capable of reliably connecting an LED array substrate and a driver substrate, a flexible cable mount method, an LED array head with such a flexible cable, and an image forming apparatus having such an LED array head.

It is another object of the present invention to provide a flexible cable capable of eliminating distortion of an LED array head by correcting an electrode pitch misalignment between an LED array substrate and a driver substrate caused by thermal expansion or contraction during thermal pressure bonding of the flexible cable, a flexible cable mount method, an LED array head with such a flexible cable, and an image forming apparatus having such an LED array head.

In order to achieve the above objects, the invention provides a flexible cable for electrical connection between electrodes on a first substrate and electrodes on a second substrate, comprising: a slit line to be used for removing a mechanical strain in the flexible cable generated when the first and/or second substrate is connected to the flexible cable; and a tear preventing round formed at an end of the slit line.

The slit line is used for correcting an electrode pitch shift caused by thermal expansion or contraction generated when the flexible cable is thermal-pressure bonded to the first or second substrate.

According to another aspect of the present invention, there is provided a method of mounting a flexible cable for electrical connection between electrodes on a first substrate and electrodes on a second substrate, comprising the steps of: connecting the flexible cable to the first and/or second substrate; and partially cutting the flexible cable from one end of the slit line to the other end of the slit line toward a tear preventing round formed at the other end of the slit line, the slit line being used for removing a mechanical strain in the flexible cable.

The slit line is used for correcting an electrode pitch shift caused by thermal expansion or contraction generated when the flexible cable is thermal-pressure bonded to the first or second substrate.

According to another aspect of the invention, there is provided an LED array head comprising the first substrate as an LED array substrate mounting an LED array; the second substrate as a driver substrate mounting a driver for driving the LED array; and the flexible cable with the slit line, the flexible cable connecting the LED array substrate and the driver substrate.

The slit line is used for correcting an electrode pitch shift caused by thermal expansion or contraction generated when the flexible cable is thermal-pressure bonded to the first or second substrate.

According to another aspect of the present invention, there is provided an image forming apparatus for forming an image through electrophotography, the apparatus comprising the LED array head.

According to another aspect of the invention, there is provided an image forming apparatus for forming a latent image on a photosensitive member by applying light to the photosensitive member, comprising: an LED array head for exposing the photosensitive member, the LED array head comprising: an LED array substrate mounting at least one LED array chip in an array shape, the LED array chip having at least one LED disposed in an array shape and formed on a semiconductor wafer for exposing the photosensitive member; a driver substrate mounting a driver IC for driving the LED chip array upon reception of an image signal; and a flexible cable for electrically connecting the LED array substrate and the driver substrate; and a slit formed in the flexible cable for correcting an electrode pitch shift between the LED array substrate and the drive substrate caused by thermal expansion or contraction generated when the flexible cable is thermal-pressure bonded.

According to another aspect of the present invention, there is provided an LED array head for use with an image forming apparatus for forming a latent image on a photosensitive member by applying light to the photosensitive member, comprising: an LED array substrate mounting at least one LED array chip in an array shape, the LED array chip having at least one LED disposed in an array shape and formed on a semiconductor wafer for exposing the photosensitive member; a driver substrate mounting a driver IC for driving the LED chip array upon reception of an image signal; and a flexible cable for electrically connecting the LED array substrate and the driver substrate, wherein a slit is formed in the flexible cable for correcting an electrode pitch shift between the LED array substrate and the drive substrate caused by thermal expansion or contraction generated when the flexible cable is thermal-pressure bonded.

When an electrode pitch shift between the LED array substrate and the drive substrate caused by thermal expansion or contraction generated when the flexible cable is thermal-pressure bonded, is to be corrected, the slit is inserted into an area of the flexible cable where the electrode pitch shift occurred after the thermal-pressure bonding.

The area the slit is inserted for correcting the electrode pitch shift caused when the flexible cable is thermal-pressure bonded, is formed with a designation for the slit, and a tear preventing round is formed in advance in order to prevent the flexible cable from being torn when the slit is inserted.

According to another aspect of the invention, there is provided an image forming apparatus having the LED array head described above.

According to another aspect of the present invention, there is provided a method of mounting an LED array head for use with an image forming apparatus for forming a latent image on a photosensitive member by applying light to the photosensitive member, comprising the steps of: electrically connecting an LED array substrate mounting at least one LED array chip in an array shape, the LED array chip having at least one LED disposed in an array shape and formed on a semiconductor wafer for exposing the photosensitive member and a driver substrate mounting a driver IC for driving the LED chip array upon reception of an image signal, by using a flexible cable; and forming the flexible cable with a slit for correcting an electrode pitch shift between the LED array substrate and the drive substrate caused by thermal expansion or contraction generated when the flexible cable is thermal-pressure bonded.

When an electrode pitch shift between the LED array substrate and the drive substrate caused by thermal expansion or contraction generated when the flexible cable is thermal-pressure bonded, is to be corrected, the slit is inserted into an area of the flexible cable where the electrode pitch shift occurred after the thermal-pressure bonding.

The area the slit is inserted for correcting the electrode pitch shift caused when the flexible cable is thermal-pressure bonded, is formed with a designation for the slit, and a tear preventing round is formed in advance in order to prevent the flexible cable from being torn when the slit is inserted.

BRIEF DESCRIPTION OF THE DRAWINGS

FIG. 10 is a diagram showing an LED array head according to another embodiment of the invention.

DETAILED DESCRIPTION OF THE PREFERRED EMBODIMENTS

Embodiments of the invention will be described in detail with reference to the accompanying drawings.

First, an SLED array chip used in the below described embodiments as an LED array chip will be detailed. This SLED (self scanning type LED array chip) has drawn attention as a printer light emitting element and is disclosed in, for example, JP-A-1-238962, JP-A-2-208067, JP-A-2-212170, JP-A-3-20457, JP-A-3-194978, JP-A-4-5872, JP-A-4-23367, JP-A-4-296579, JP-A-5-84971, a proposal "Optical printer light emitting element array integrated with driver circuit", Japan Hard Copy, 1991(A-17), and a proposal "Self scanning type light emitting element (SLED) using PNPN thyristor structure," The Institute of Electronics, Information and Communication Engineers, 1990. 3. 5.

Figure 1:
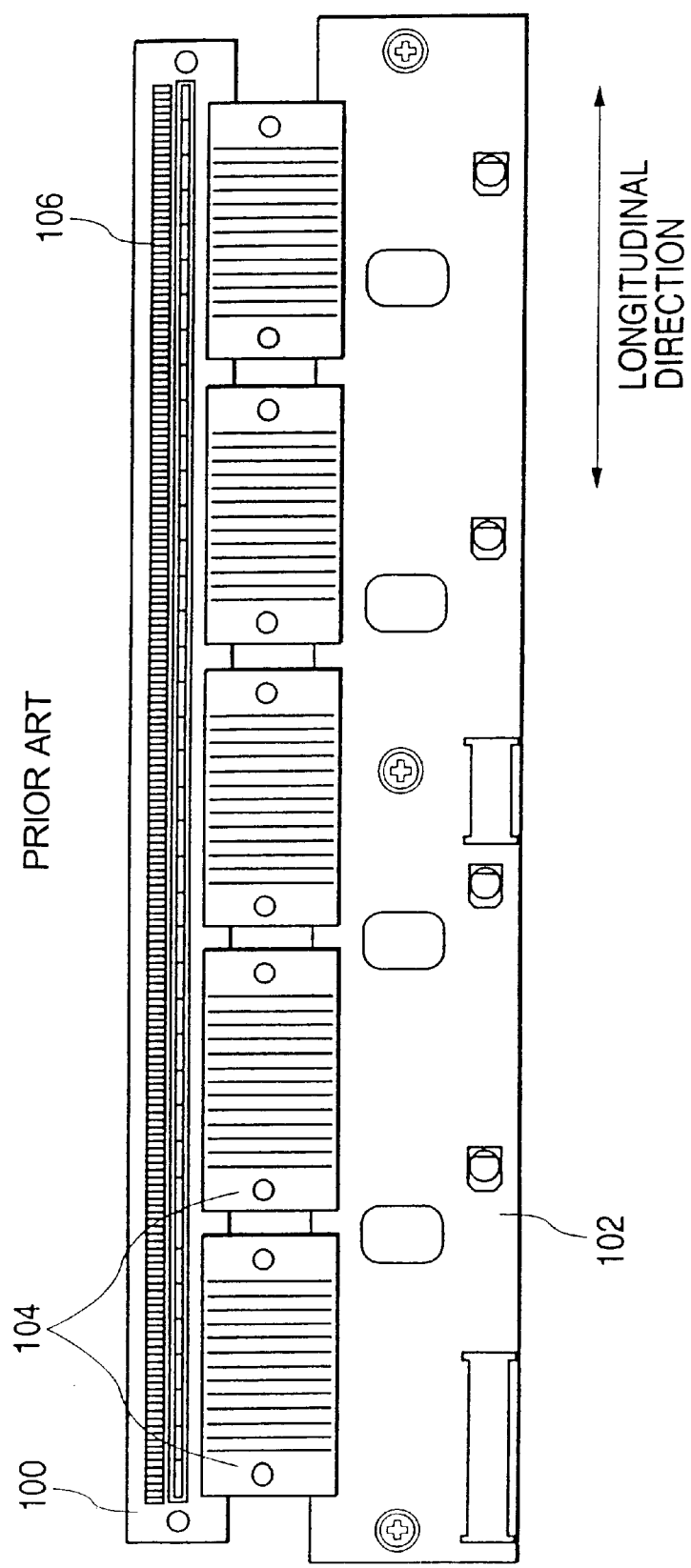
FIG. 1 is a diagram showing a flexible cable of an LED array head, the flexible cable being constituted of a plurality of flexible cable units.
Figure 2:
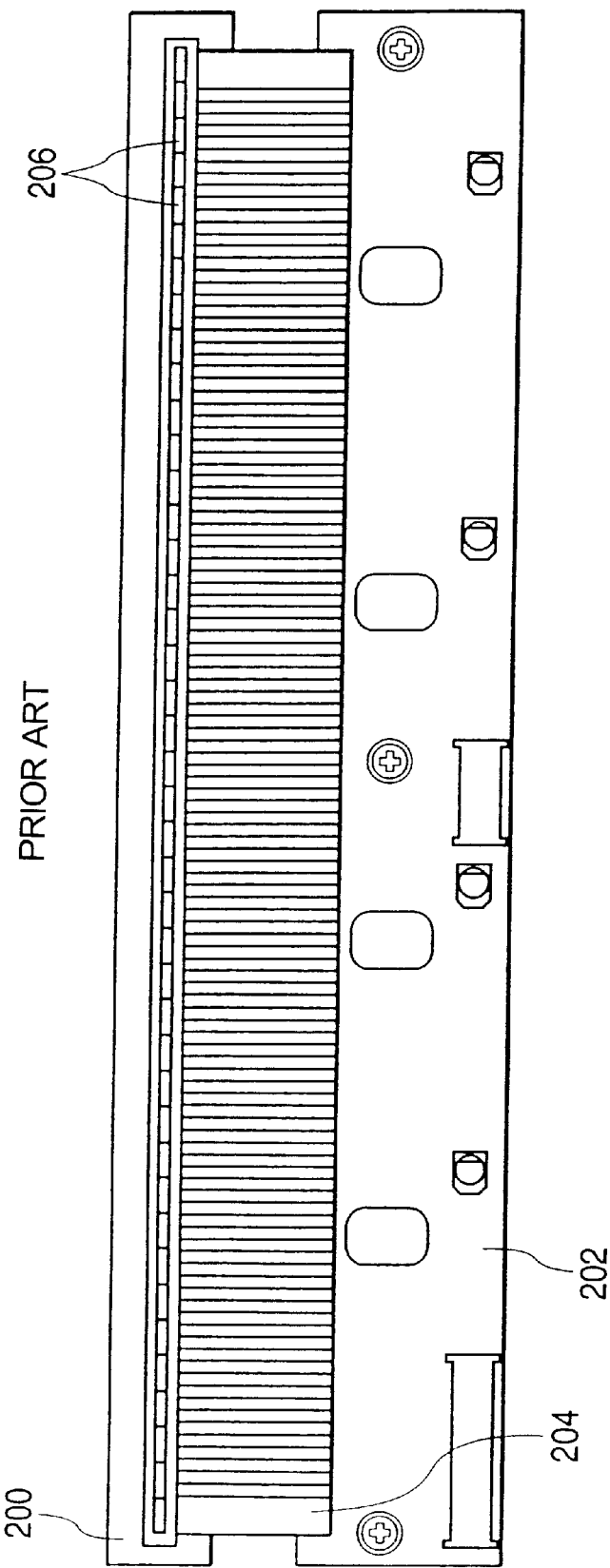
FIG. 2 is a diagram showing a single continuous flexible cable of an LED array head.
Figure 3:
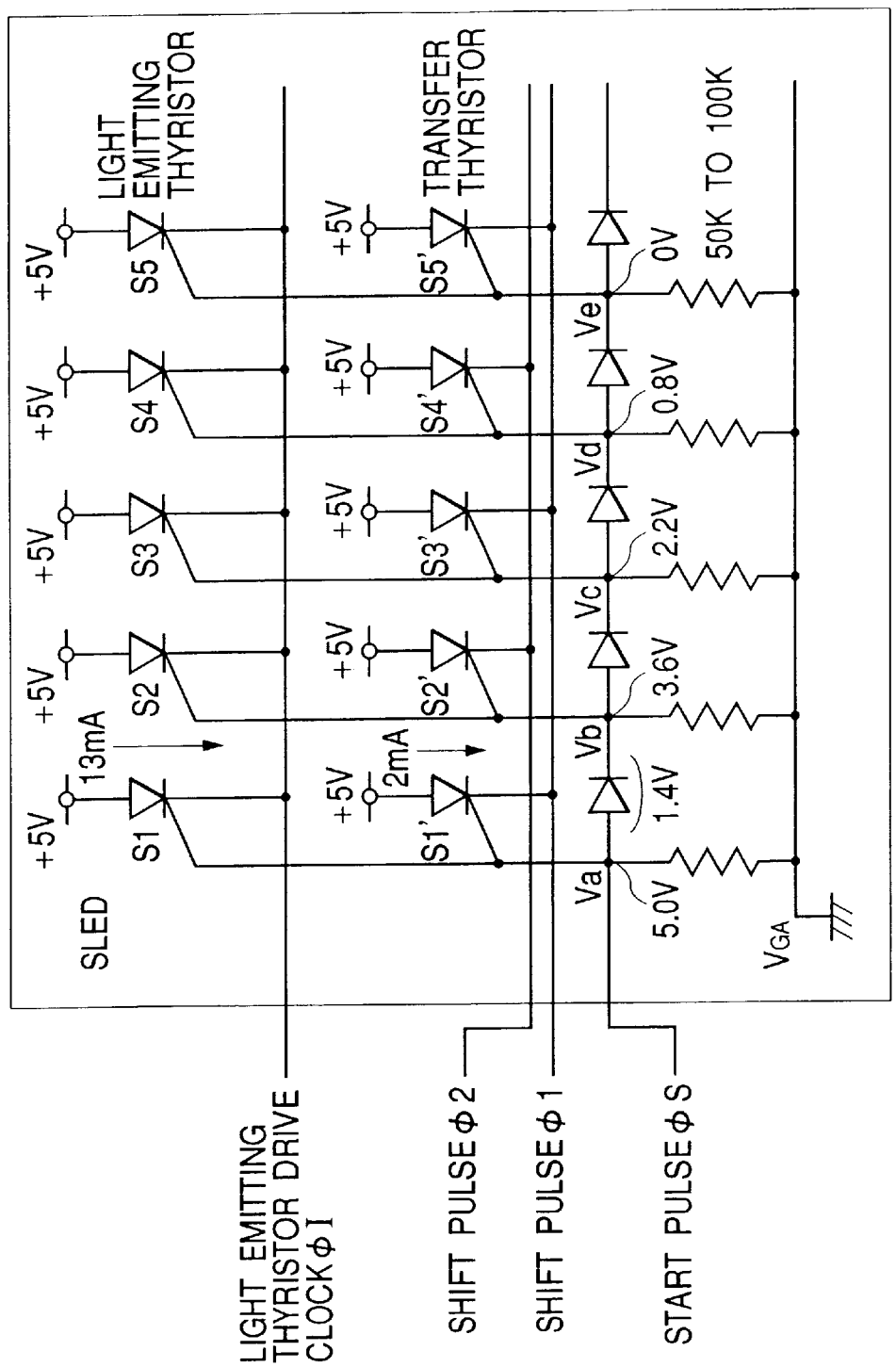
FIG. 3 is an equivalent circuit of an SLED chip used by an embodiment of the invention.
Figure 4:
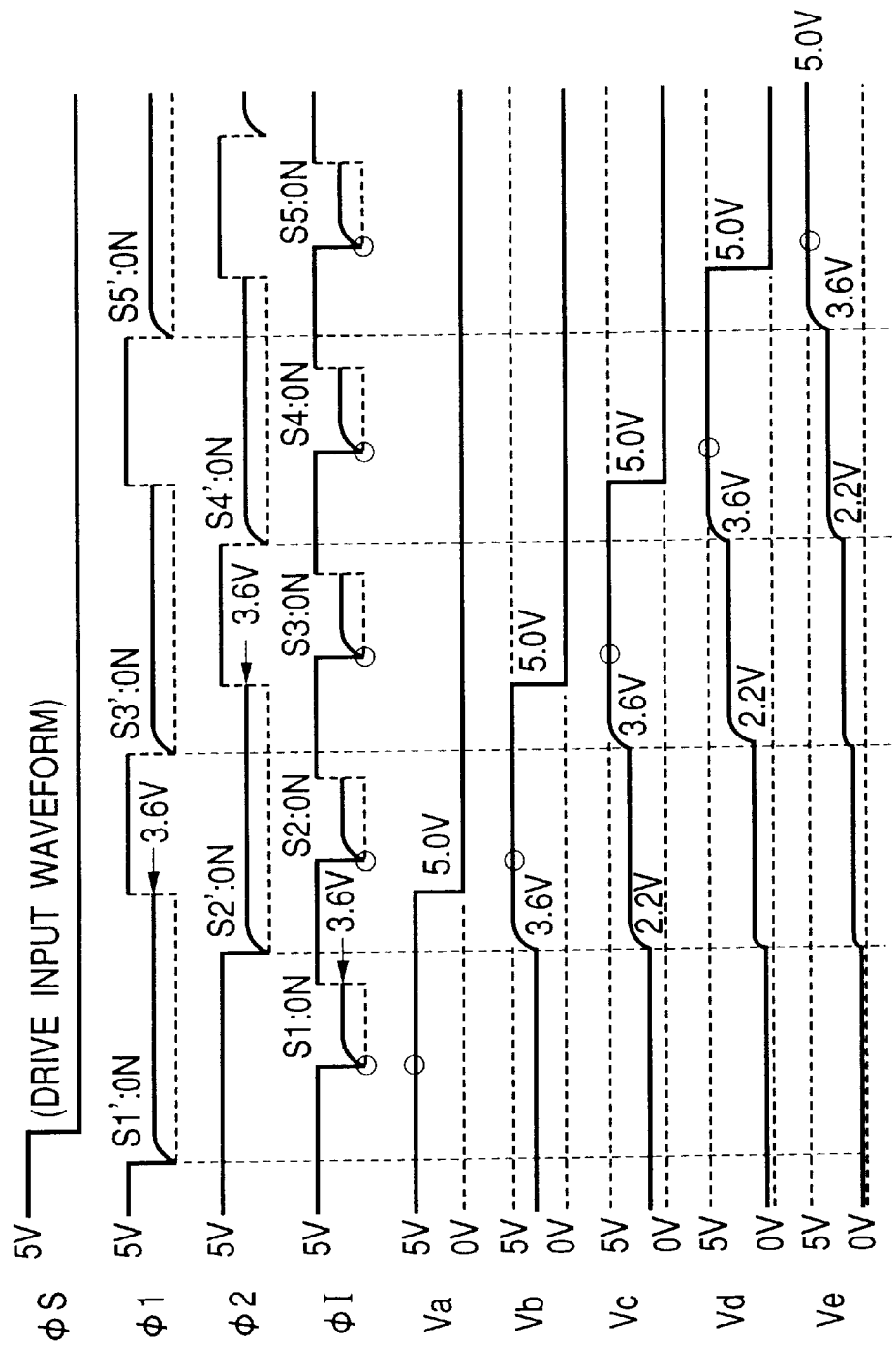
FIG. 4 is a timing chart illustrating the operation of the SLED chip shown in FIG. 3.

FIG. 3 is an equivalent circuit of an SLED used for an LED array chip. FIG. 4 is a timing chart of control signals and timing signals for controlling an SLED, and in this example, all elements are tuned on. $V_{GA}$ shown in FIG. 3 represents a power source line. A start pulse φS line is connected to cascade-connected diodes D1 to D5. An anode of each diode is connected to the power source line $V_{GA}$ via a corresponding one of resistors R1 to R5 (50 kΩ to 100 kΩ).

As shown in FIG. 3, the SLED has transfer thyristors S1' to S5' disposed in an array and light emitting thyristors S1 to S5 disposed in an array. The gates of these thyristors are connected in common. The gates of the first pair of thyristors are connected to the start pulse φS line or anode of the first diode, the gates of the second pair of thyristors are connected to the cathode of the first diode, the gates of the third pair of thyristors are connected to the cathode of the second diode, an so on.

Next, with reference to the timing chart shown in FIG. 4, a transfer and light emission process will be described. A transfer process starts when φS is changed from 0 V to 5 V. When φS becomes 5 V, it becomes that Va=5 V, Vb=3.6 V (assuming that the forward voltage drop of the diode is 1.4 V), Vc=2.2 V, Vd=0.8 V, and Ve=0 V. The gates of the transfer thyristors S1' and S2' therefore change from 0 V to 5 V and 3.6 V, respectively. In this state, 41 is changed from 5 V to 0 V so that the transfer thyristor S1' takes 5 V at its anode, 0 V at its cathode, and 3.6 V at its gate, satisfying the ON condition of the transfer thyristor S1 to turn it on. In this state, even if φS is changed to 0 V, Va 5 V because the thyristor S1' is on (because φS is applied via a resistor and when the thyristor turns on a potential between the anode and gate is nearly zero). Therefore, even if φS is changed to 0 V, the ON condition of the first thyristor is retained and the first shift operation is completed.

In this state, φI for a light emitting thyristor is changed from 5 V to 0 V so that the same ON condition as the transfer thyristor is satisfied and the light emitting thyristor S1 turns on to illuminate the first LED. As φI is changed to 5 V, the potential difference between the anode and cathode of the light emitting thyristor S1 becomes zero so that it cannot flow a minimum retaining current and is turned off.

Next, a transfer of the thyristor ON condition from the transfer thyristor S1' to S2' will be described. Even if the light emitting thyristor S1 turns off, φ1 maintains 0 V. Therefore, the transfer thyristor S1' maintains on and takes Va 5 V, and Vb 3.6 V. In this state, φ2 is changed from 5 V to 0 V so that the transfer thyristor S2' takes 5 V at its anode, 0 V at its cathode, and 3.6 V at its gate and is turned on.

After the transfer thyristor S2' turns on, φ1 is changed from 0 V to 5 V so that the transfer thyristor S1' turns off similar to the case that the light emitting thyristor S1 turns off. In the above manner, the ON state of the transfer thyristor is changed from S1' to S2'. In this state, as φI is changed from 5 V to 0 V, the light emitting thyristor S2 turns on and is illuminated.

The reason why only the light emitting thyristor whose transfer thyristor is on can illuminate is as follows. If the transfer thyristor is not on, the gate voltage of the transfer thyristor is 0 except the thyristor next to the turned-on thyristor, so that the ON condition of the thyristor is not satisfied. As the light emitting thyristor turns on, the potential of φI takes 3.6 V (because of a forward voltage drop of the light emitting thyristor), the thyristor next to the turned-on thyristor has no potential difference between the gate and cathode, and cannot be turned on.

In this embodiment, the SLED chip of the LED head can be driven by six wiring lines including five signal lines φS, φI, φ1, φ2 and $V_{GA}$ and one reference power source line of 5 V.

Figure 5:
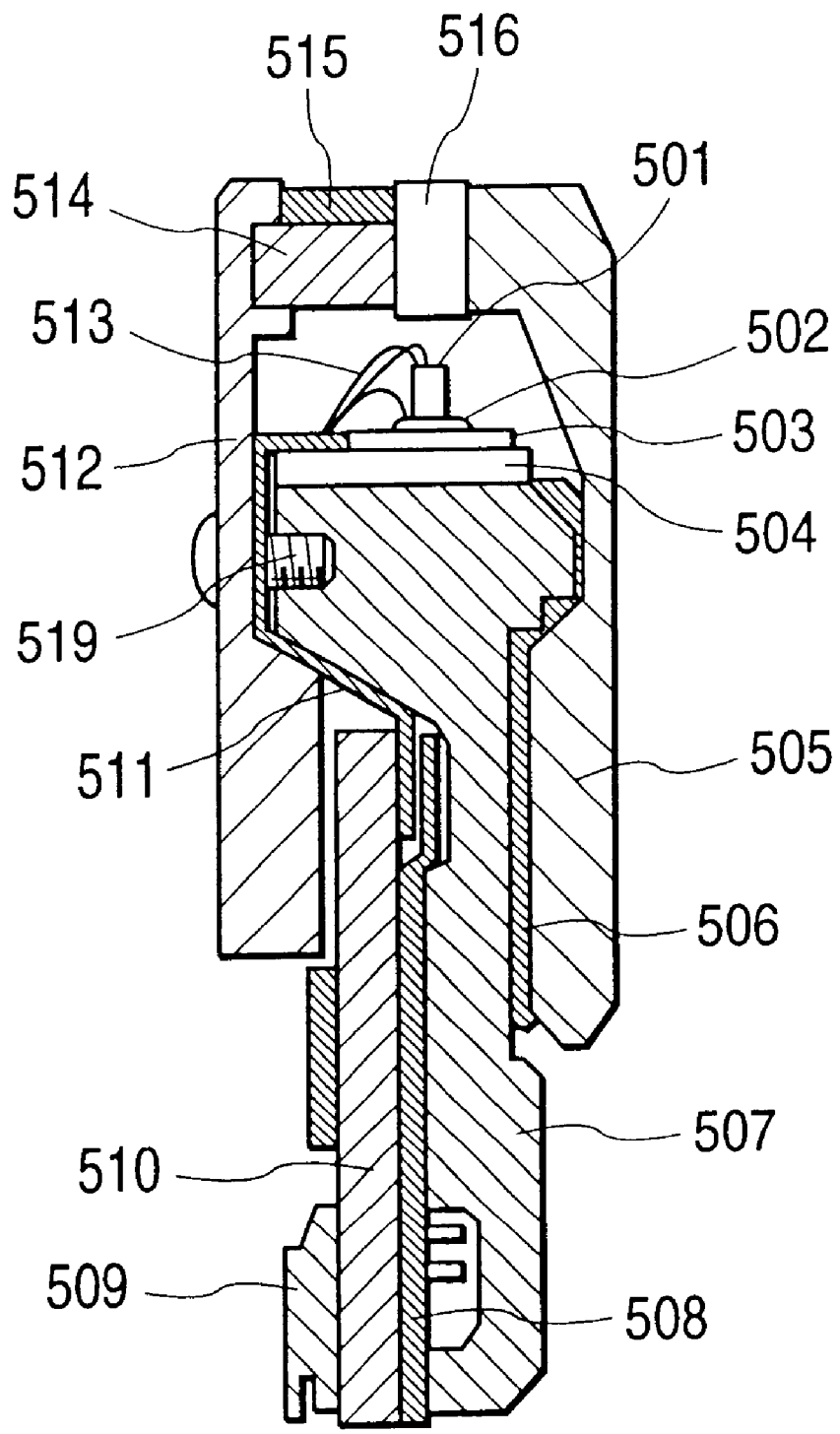
FIG. 5 is a cross sectional view showing an example of the structure of an SLED head according to an embodiment.
Figure 6:
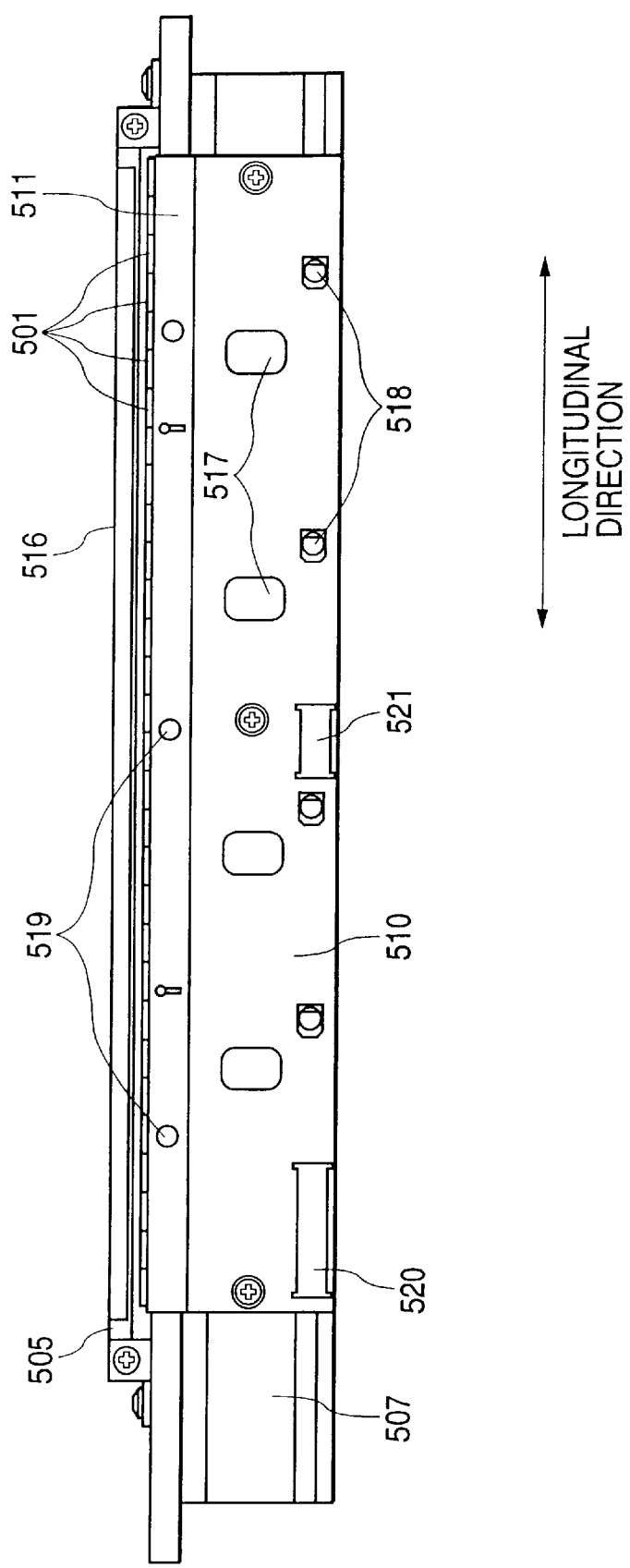
FIG. 6 is a left side view of the SLED head shown in FIG. 5.
Figure 7:
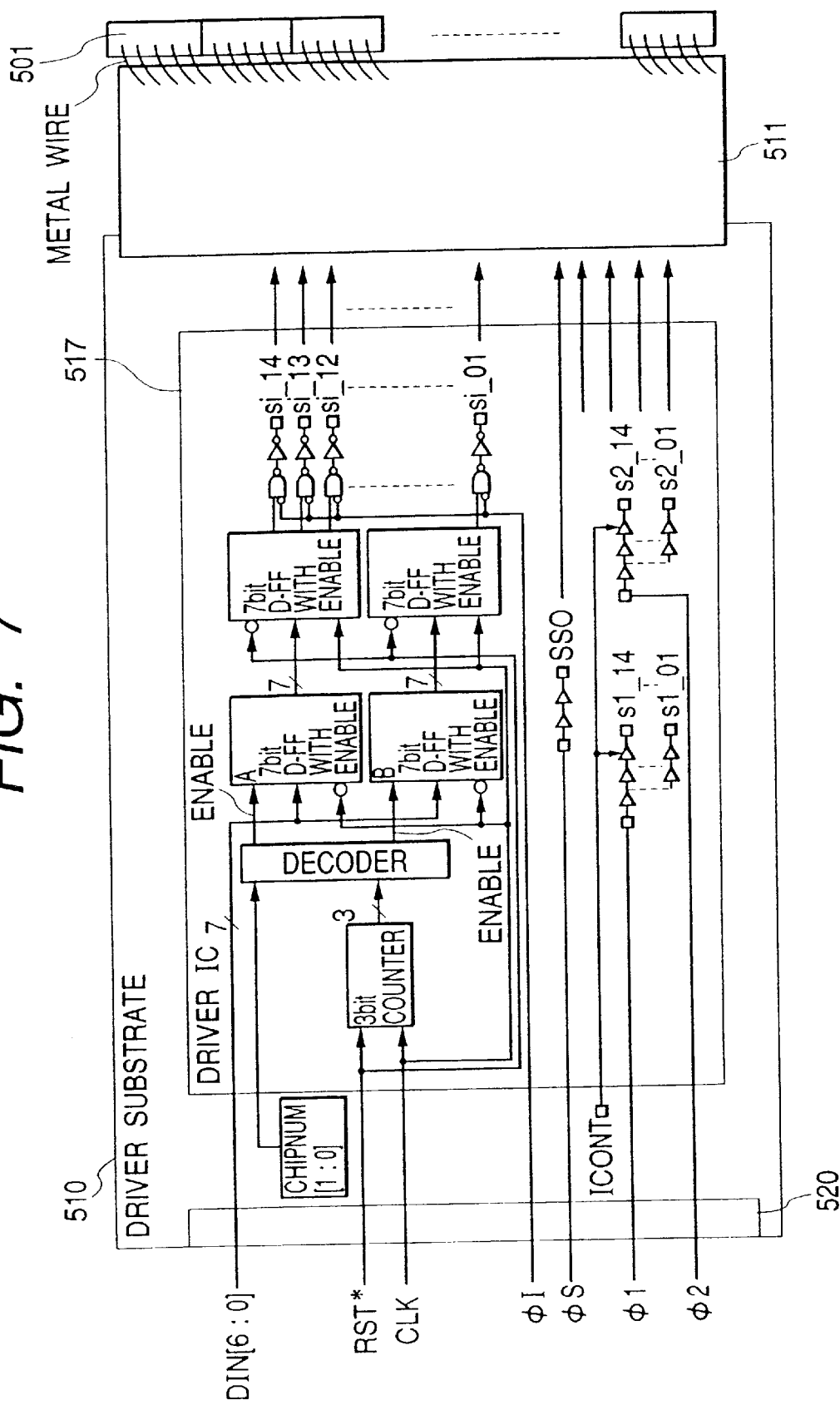
FIG. 7 is a circuit diagram showing the electrical structure of the SLED head shown in FIGS. 5 and 6.

The SLED head shown in FIGS. 5 and 6 can be formed by using two substrates, an SLED array substrate on which the SLED chip is mounted and a drive substrate on which a driver IC for driving the SLED chip is mounted.

FIG. 5 is a cross sectional view showing an example of the structure of the SLED head of an elongated shape according to an embodiment. FIG. 6 is a left side view of the SLED head shown in FIG. 5 and showing the SLED head along its longitudinal direction. In FIGS. 5 and 6, reference numeral 501 indicates the SLED chip having light emitting elements, reference numeral 502 represents silver paste for die-bonding the SLED chip 501 to an electrode pattern 503 printed with silver or gold on a substrate 504 made of ceramic or the like. The substrate 504 is preferably made of ceramic because of its flatness and deformation resistance. Also, ceramic has also good heat dissipation characteristics.

The substrate 504 mounted with the SLED chip 501 is fixed to a base 507 made of aluminum or the like by an adhesive. Using aluminum for the base 507 is advantageous because aluminum has good heat dissipation characteristics. A flexible cable 511 is thermally bonded to the substrate 504 with thermally setting adhesive (e.g., type 88c63X manufactured by Sony Chemical). Each electrode of the flexible cable 511 on the side of the substrate 504 is plated with gold. Each gold plated electrode is connected to a corresponding one of terminals of the SLED chips 501 by a gold wire 513.

A driver substrate 510 made of glass epoxy and mounted with a driver IC 517 is soldered to the flexible cable 511 on the side opposite to the SLED chip 501. Reference numeral 516 represents a glass rod lens (a distributed refraction factor index) for condensing light output from the SLED chip 501. Reference numeral 505 represents an aluminum plate for fixing the glass rod lens 516 on a flat surface. Reference numeral 506 represents an elastic member such as silicon resin which is filled in a space between the aluminum plate 505 and aluminum base 507 in order to prevent dust from entering the inner space near the SLED chip 501. Reference numeral 508 represents an insulating sheet for electrically insulating electrodes on the bottom surface of the driver substrate 510 from the aluminum base 507. Reference numerals 509 and 520 represent connectors for supplying signals and power to the driver IC mounted on the driver substrate 510. Reference numeral 512 represents a cover made of mold material. Reference numeral 514 represents an ept sealer for preventing dust from entering the inner space near the SLED chip. Reference numeral 515 represents silicon resin for preventing dusts from entering the inner space near the SLED chip. Reference numeral 518 represents an aluminum electrolytic capacitor, and reference numeral 519 represents a screw hole used for fixing the cover 512.

Each signal is input via the connector 520 of the driver substrate 510 to each driver IC 517 mounted on the driver substrate. Each driver IC is assigned CHIPNUM as its address. A CHIPNUM is 2 bits and takes one of 00, 01, 10 and 11 which are set in advance on the driver substrate. The 2-bit CHIPNUM and an externally input 3-bit count value are decoded so that proper input data is supplied to each driver IC. Data DIN [6:0] is light emission data of each SLED chip. An RST* signal resets a 3-bit base clock counter in the driver IC, and also operates to latch the data DIN when a clock rising edge is input during the low period of RST*. The latched data and $\phi I$ is supplied to gates to output light emitting signals to fourteen SLED chips. Fourteen sets of $\phi 1$ and $\phi 2$ are supplied to drive the fourteen SLED chips, wherein one $\phi S$ is supplied to drive all fourteen SLED chips. Drive currents for ($\phi 1$ and $\phi 2$ can be adjusted by using ICONT set to each driver IC 517 on the driver substrate.

Figure 8:
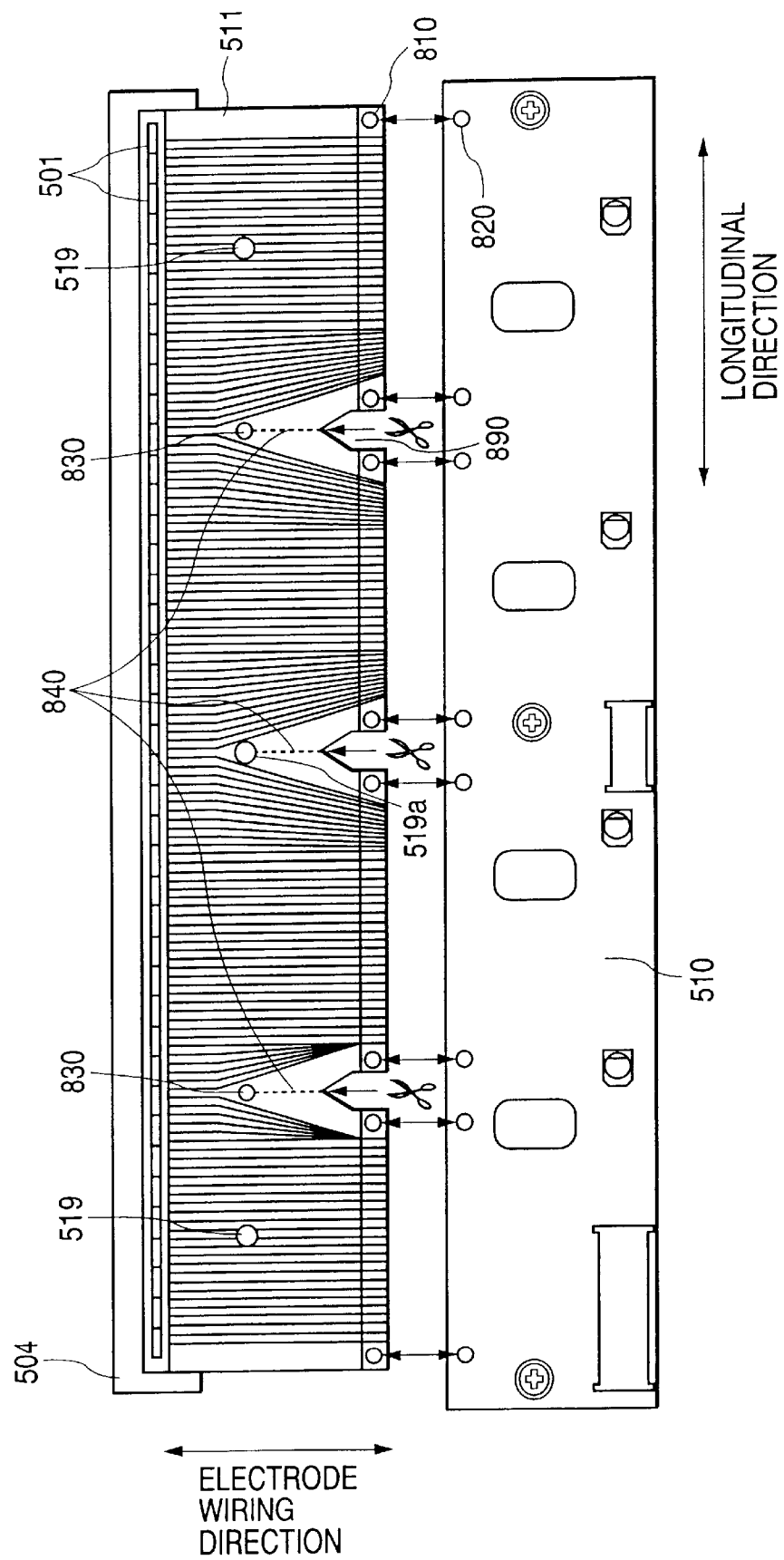
FIG. 8 is a diagram illustrating an example of the shape of a flexible cable and its mount method, according to an embodiment of the invention.

FIG. 8 is a schematic diagram illustrating the stripe-shaped flexible cable 511 thermal-pressure bonded to the substrate 504 mounting the SLED chips 501 shown in FIG. 5, as viewed along the longitudinal direction of the SLED chips 501. The whole length of the SLED chips 501 disposed along the longitudinal direction is 30 cm or longer. As shown in FIG. 8, the flexible cable 511 is a single continuous cable. The total number of electrodes of the flexible cable is at least 6×56=336, assuming that one SLED chip has six electrodes and fifty six SLED chips are to be driven. These electrodes can be wired to the electrodes of the SLED chips at a constant pitch and in one-to-one correspondence there between. The flexible cable having 336 electrodes disposed at a constant pitch has a shape that the area of the flexible cable on the side of the driver substrate 510 is divided into an optional number of areas, e.g., four areas. Each of the four divided areas is formed with positioning holes 810 used for position alignment with the driver substrate 510, by using unrepresented pins inserted into the positioning holes 810 and into positioning holes 820 formed through the driver substrate 510. In this embodiment, although the electrodes of the flexible cable are divided into four areas, the number of areas may be determined as desired depending upon possible deformation or distortion of the flexible cable and reliable electric connection to the driver substrate. The positioning holes 810 are formed, for example, along one side of the elongated flexible cable on the side of the driver substrate.

An area between adjacent four-divided areas is not formed with electrodes wires, but is formed with a hole 830 with a tear preventing pattern (hereinafter called a tear preventing hole). The area where electrode wires area not formed expands from the tear preventing hole 830 toward one side of the flexible cable on the side of the driver substrate. When position alignment is to be performed between the flexible cable 511 and driver substrate 510, the flexible cable is partially cut in the area where the electrode wires are not formed, from one side on the drive substrate to the tear preventing hole 830, if necessary, in order to correct the position misalignment to be caused by thermal expansion or contraction generated when the flexible cable 511 is thermal-pressure bonded to the substrate 504 (refer to FIG. 5). A pitch shift adjusting slit line 840, i.e., a line along which the flexible cable is partially cut, may be formed if necessary in a connection area between adjacent four-divided areas of the flexible cable, i.e, in the area where the electrode wires are not formed. In this case, the flexible cable can be partially cut along the slit line without inadvertently cutting electrode wires. Namely, by using the pitch shift slit line 840, the base and cover portions of the flexible cable 511 are partially cut along the slit line to the tear preventing hole 830 with a cutter or the like so that a slit or cut is formed and the mutual positions of the electrodes of the flexible cable 511 and driver substrate 510 can be adjusted, and hence the mutual positions of the positioning holes 810 and 820 can be adjusted. The slit line 840 may be a dotted line formed by through holes or a line formed by press bending. Without forming the slit line 840, a slit may be formed.

On three screw holes 519 shown in FIG. 8, a middle screw hole 519a provides both the functions of the tear preventing hole and screw hole. A recess 890 may be formed in the flexible cable along one side on the driver substrate side. The cut length of the flexible cable to the tear preventing hole can be shortened.

In this embodiment, although the tear preventing hole of a circular shape is used, the hole may take other shapes different from a circle, such as a polygon including a triangle, or the like, and an ellipsoid. The peripheral area of the hole may be formed with a tear preventing ring of a reinforcing material such as copper foil.

Figure 9:
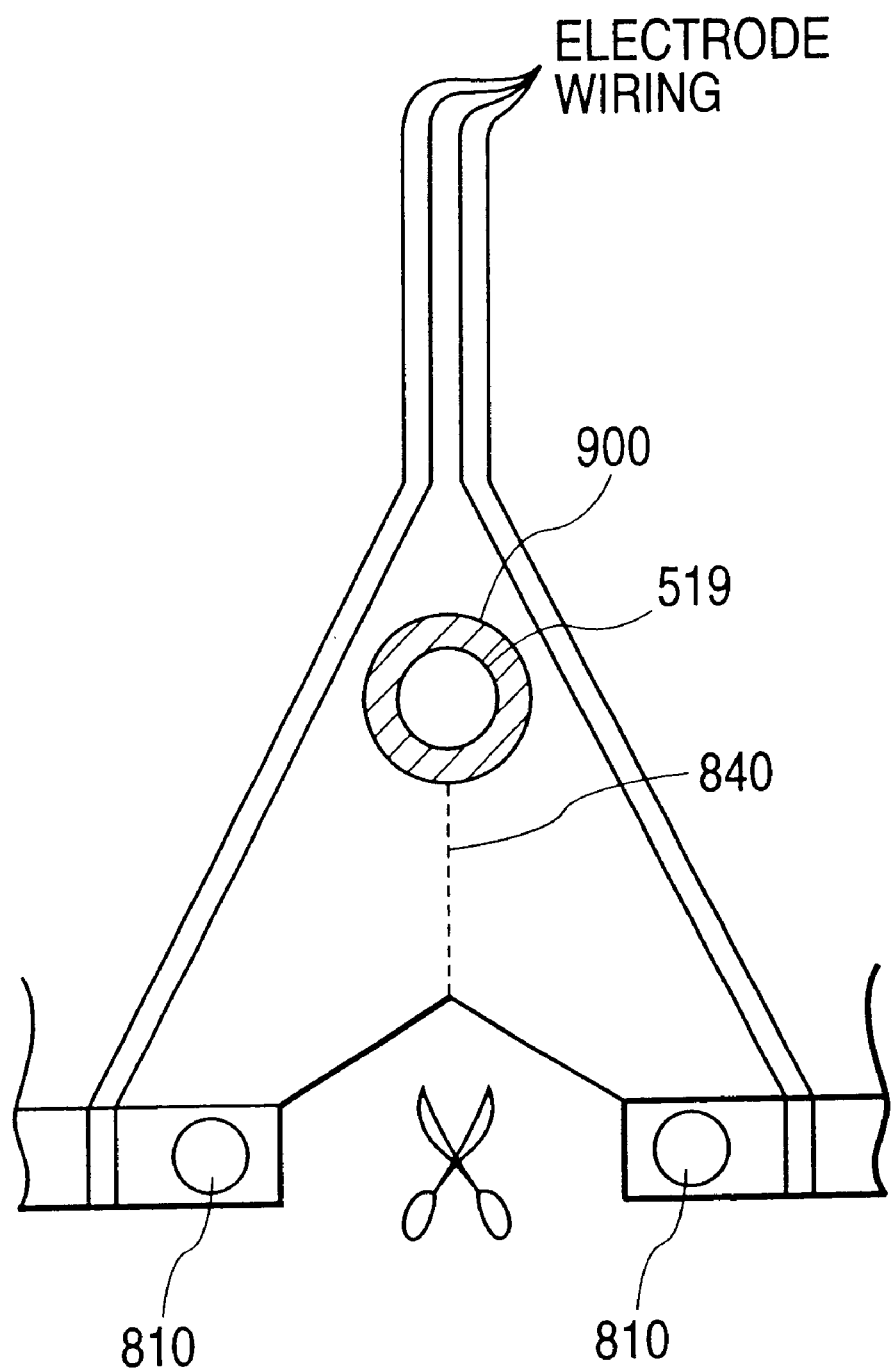
FIG. 9 is a schematic diagram showing a round formed around a tear preventing hole.

FIG. 9 is a schematic diagram showing a ring 900 formed at the peripheral area of a tear preventing hole. As shown, the ring is formed at the peripheral area of a tear preventing hole 519, the ring being made of a material having a tear preventing effect better than that of the base material of the flexible cable. When the flexible cable is partially cut, it is cut to this ring.

In this embodiment, the SLED chips 501 are disposed at a constant pitch so that the electrodes of the SLED chips 501 are also disposed at a constant pitch. Namely, the 336 electrodes described earlier are disposed linearly at the constant pitch along the longitudinal direction.

Electrode wires on the flexible cable are also disposed at the constant pitch in order to electrically connect them to those of the SLED chips 501. The electrodes wires of the flexible cable are therefore disposed at the constant pitch along one side thereof on the SLED chip 501 side.

Electrode wires on the flexible cable are also disposed at the constant pitch on the driver substrate 510 side, because electrode connections (not shown) on the driver substrate 510 are also disposed at the constant pitch.

The spaces between the electrode wires of the flexible cable on the SLED chip 501 side may be equal to or different from those between the electrode wires on the driver substrate 510 side.

The spaces between the electrode wires of the flexible cable on the driver substrate 510 side may be equal or different.

FIG. 10 is a schematic diagram showing a flexible cable whose electrode wires curve around screw holes 519, according to another embodiment of the invention. The other structures are the same as those shown in FIG. 8.

As shown in FIG. 10, electrode wires of the flexible cable are disposed at a constant pitch on the side of an SLED chip 501 and also on the side of a driver substrate 510.

A tear preventing hole 830 is preferably smaller than the screw hole 519 because it is possible to prevent the electrode wire from becoming long because of a curved layout and to prevent a large resistance of the electrode wire.

A middle screw hole 519a provides both the functions of the tear preventing hole and screw hole.

A tear preventing ring may be formed also for the tear preventing hole shown in FIG. 10.

In the above embodiments, an SLED chip is used as light emitting elements. In this invention, the above-described flexible cable may be used for the electrical connection to light receiving semiconductor elements such as a linear line sensor.

In the above embodiments, an image forming apparatus for forming a latent image on a photosensitive member by applying light to the photosensitive member, has an LED array substrate mounting at least one LED array chip in an array shape, the LED array chip having at least one LED disposed in an array shape and formed on a semiconductor wafer for exposing the photosensitive member, and a driver substrate mounting a driver IC for driving the LED chip array upon reception of an image signal. The LED array substrate and driver substrate are electrically connected by using a flexible cable to form an LED array head. Since a slit is formed in the flexible cable, an electrode pitch shift between the LED array substrate and the drive substrate caused by thermal expansion or contraction generated when the flexible cable is thermal-pressure bonded, can be corrected. Color mixture of a print line can be eliminated without applying stress to the LED array substrate.

When an electrode pitch shift between the LED array substrate and the drive substrate caused by thermal expansion or contraction generated when the flexible cable is thermal-pressure bonded, is to be corrected, the slit is inserted into an area of the flexible cable where the electrode pitch shift occurred after the thermal-pressure bonding. Accordingly, only the electrode portion where the pitch shift occurred can be corrected. Since the slit is not formed before the flexible cable is mounted, the mount operation is easy.

The area into which the slit is inserted for correcting the electrode pitch shift caused when the flexible cable is thermal-pressure bonded, is formed with a designation for the slit, and a tear preventing ring is formed in advance in order to prevent the flexible cable from being torn when the slit is inserted. Accordingly, the flexible cable is not torn when the slit is inserted to correct the electrode pitch shift caused by heat during the mount operation.

As described so far, according to the present invention it is possible to realize a flexible cable capable of reliably connecting an LED array substrate and a driver substrate, a flexible cable mount method, an LED array head with such a flexible cable, and an image forming apparatus having such an LED array head.

According to the present invention, it is also possible to realize a flexible capable of eliminating distortion of an LED array head by correcting an electrode pitch misalignment between an LED array substrate and a driver substrate to be caused by thermal expansion or contraction during thermal pressure bonding of the flexible cable.

What is claimed is:

1. A light emitting element array head for exposing a photosensitive body, comprising:
    a plurality of chips each of which includes a plurality of light emitting elements arranged in line so that the light emitting elements thereof may be arranged at substantially equal intervals, said plurality of chips arranged in line;
    a driving unit that drives said plurality of light emitting elements; and
    a flexible cable for electrically connecting said plurality of light emitting elements and said driving unit, said flexible cable having an electric wire for connecting each of said plurality of chips and said driving unit, said flexible cable being flat and elongated along the direction of the arrangement of the light emitting elements,
    wherein the electric wire is arranged into a plurality of spaced electric wire groups comprising a plurality of spaced wires and the spaces between adjoining electric wire groups are greater than the spaces between the electric wires in each of the electric wire groups, and
    wherein said light emitting element array head further comprises a split preventing hole, provided between the adjoining electric wire groups, for preventing said flexible cable from splitting.

2. A light emitting element array head according to claim 1, wherein said flexible cable has sufficient length to allow it to be cut between said adjoining electric wire groups.

3. A light emitting element array head according to claim 2, wherein said flexible cable is cuttable with a cutting tool.

4. A light emitting element array head according to claim 2, further comprising a reinforcement member for reinforcing said split preventing hole.

5. A light emitting element array head according to claim 1, further comprising:
    a first substrate on which said plurality of chips are provided; and
    a second substrate on which said driving unit is provided, wherein said flexible cable connects said first substrate with said second substrate.

6. A light emitting element array head according to claim 5, wherein said flexible cable is provided along a longitudinal direction of said first and second substrates and a space between adjoining electric wire groups is greater than the spaces between the spaced electric wires in each of the electric wire groups in said flexible cable on a side of said flexible cable proximate to said second substrate.

7. A light emitting element array head according to claim 6, further comprising a concave portion provided between adjoining electric wire groups, said concave portion concave toward said first substrate.

8. A light emitting element array head according to claim 5, wherein said flexible cable has a locating hole for locating said flexible cable on said second substrate, the locating hole provided on a side of said flexible cable and on an end portion thereof that is connected to said second substrate.

9. A light emitting element array head according to claim 5, wherein said flexible cable has a plurality of screw holes through which a screw for attaching a cover for protecting said first substrate may pass.

10. A light emitting element array head according to claim 9, wherein at least one of said plurality of screw holes is common to said split preventing hole.

11. A light emitting element array head according to claim 10, wherein a diameter of said split preventing hole is smaller than that of the at least one of said plurality of screw holes.

12. A light emitting element array head according to any one of claims 1 to 3 and 4 to 11, wherein each of said plurality of light emitting elements is a light emitting diode.

13. A light emitting element array head for exposing a photosensitive body, comprising:
    a plurality of chips each of which includes a plurality of light emitting elements arranged in line so that the light emitting elements thereof may be arranged at substantially equal intervals, said plurality of chips arranged in line;
    a driving unit that drives said plurality of light emitting elements; and
    a flexible cable for electrically connecting said plurality of light emitting elements and said driving unit, said flexible cable having an electric wire for connecting each of said plurality of chips and said driving unit, said flexible cable being flat and elongated along the direction of the arrangement of the light emitting elements, wherein the electric wire is arranged into a plurality of spaced electric wire groups comprising a plurality of spaced wires and the spaces between adjoining electric wire groups are greater than the spaces between the electric wires in each of the electric wire groups, and wherein said driving unit comprises a plurality of drivers, each driver corresponding to an electric wire group.

14. A light emitting element array head according to claim 13, wherein each of said plurality of chips is connected to one of the spaced electric wires and the spaced electric wires that are connected to a chip are connected to said driving unit.

* * * * *

UNITED STATES PATENT AND TRADEMARK OFFICE
CERTIFICATE OF CORRECTION

PATENT NO. : 6,611,280 B1
DATED : August 26, 2003
INVENTOR(S) : Shiraishi et al.

It is certified that error appears in the above-identified patent and that said Letters Patent is hereby corrected as shown below:

Column 5,
Line 37, "41" should read -- $\phi 1$ --;
Line 41, "Va 5 V" should read -- $Va \simeq 5\ V$ --; and
Line 58, "Va 5 V, and Vb 3.6 V." should read -- $Va \approx 5V$, and $Vb = 3.6\ V$. --.

Column 10,
Line 50, "claims 1 to 3 and 4 to 11," should read -- claims 1 to 11, --.

Signed and Sealed this

Fourth Day of January, 2005

JON W. DUDAS
*Director of the United States Patent and Trademark Office*